United States Patent [19]
Kosa et al.

[11] Patent Number: 4,764,479
[45] Date of Patent: Aug. 16, 1988

[54] SEMICONDUCTOR INTEGRATED CIRCUIT DEVICE AND METHOD OF MANUFACTURING THE SAME

[75] Inventors: Yasunobu Kosa; Kazuhiro Komori, both of Kodaira, Japan

[73] Assignee: Hitachi, Limited, Tokyo, Japan

[21] Appl. No.: 897,391

[22] Filed: Aug. 15, 1986

Related U.S. Application Data

[62] Division of Ser. No. 668,675, Nov. 5, 1984, abandoned, which is a division of Ser. No. 428,954, Sep. 30, 1982, abandoned, which is a division of Ser. No. 186,739, Sep. 12, 1980, Pat. No. 4,373,249.

[30] Foreign Application Priority Data

Feb. 20, 1980 [JP] Japan .................................. 55-18983

[51] Int. Cl.[4] .......................................... H01L 29/78
[52] U.S. Cl. ........................................ 437/49; 437/50; 437/52
[58] Field of Search ................... 357/23.5; 437/49, 52, 437/50

[56] References Cited

U.S. PATENT DOCUMENTS

| | | | |
|---|---|---|---|
| 3,925,803 | 12/1975 | Kobayashi | 357/22 |
| 3,930,067 | 12/1975 | Gorrissen | 427/86 |
| 4,151,021 | 4/1979 | McElroy | 437/49 |
| 4,273,805 | 6/1981 | Dawson et al. | 427/88 |
| 4,302,766 | 11/1981 | Guterman et al. | 357/41 |
| 4,471,373 | 9/1984 | Shimizu et al. | 357/41 |
| 4,495,693 | 1/1985 | Iwahashi et al. | 29/571 |
| 4,517,732 | 5/1985 | Oshikawa | 29/571 |

FOREIGN PATENT DOCUMENTS

| | | | |
|---|---|---|---|
| 0063686 | 5/1977 | Japan | 357/23.5 |
| 0139495 | 10/1979 | Japan | 357/23.5 |

*Primary Examiner*—Olik Chaudhuri
*Attorney, Agent, or Firm*—Kenyon & Kenyon

[57] ABSTRACT

A semiconductor integrated circuit device, especially an EPROM (Electrically Programmable Read Only Memory) device which consists of an MIS type memory transistor portion having a floating gate electrode and a control gate electrode on said floating gate electrode, and of an MIS type transistor portion having a gate electrode is formed by patterning the same conductor layer as the floating gate electrode in the periphery of said MIS type memory transistor portion.

8 Claims, 7 Drawing Sheets

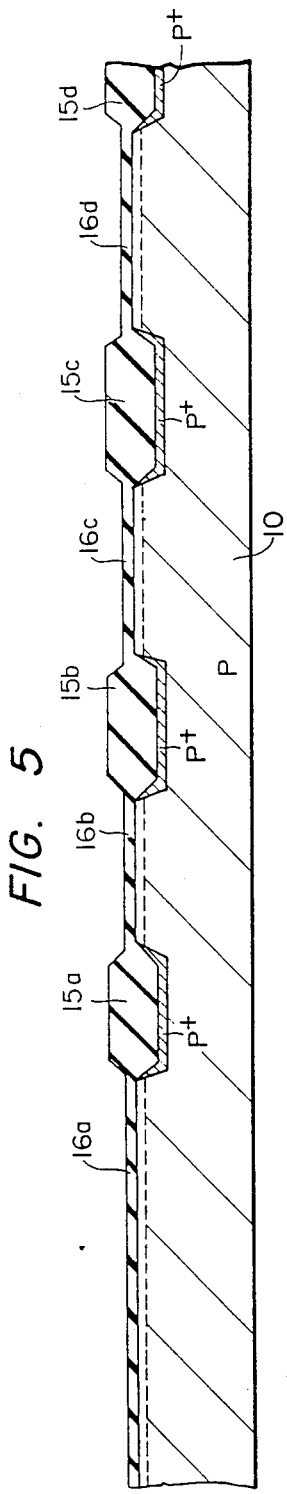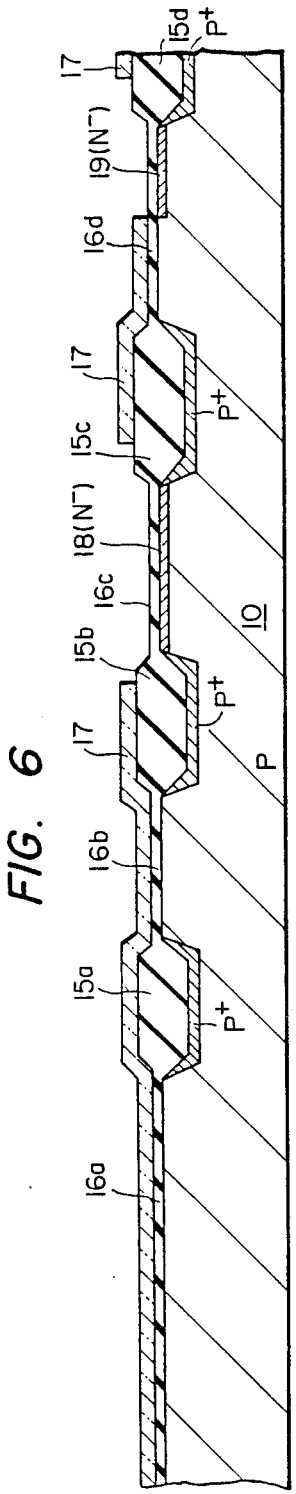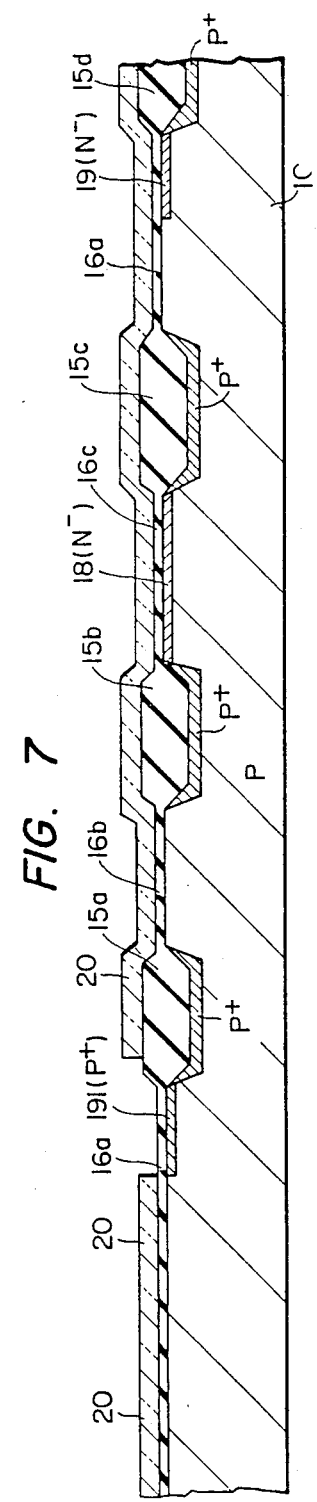

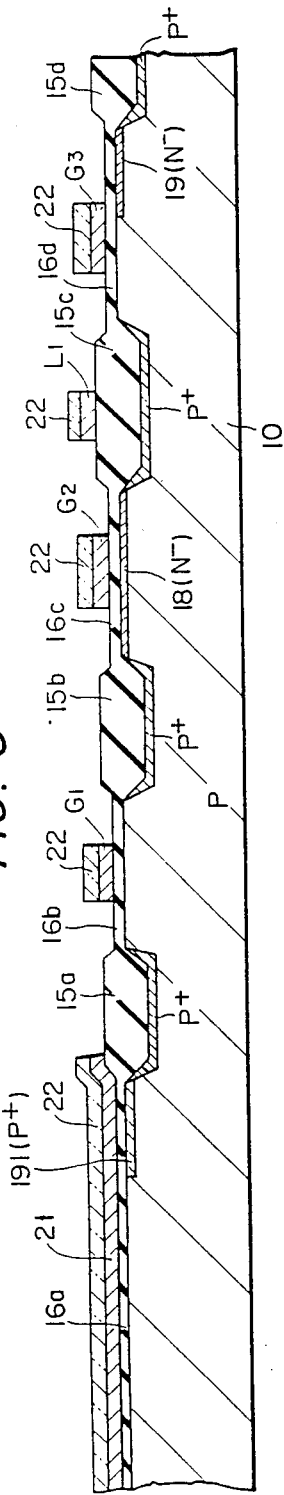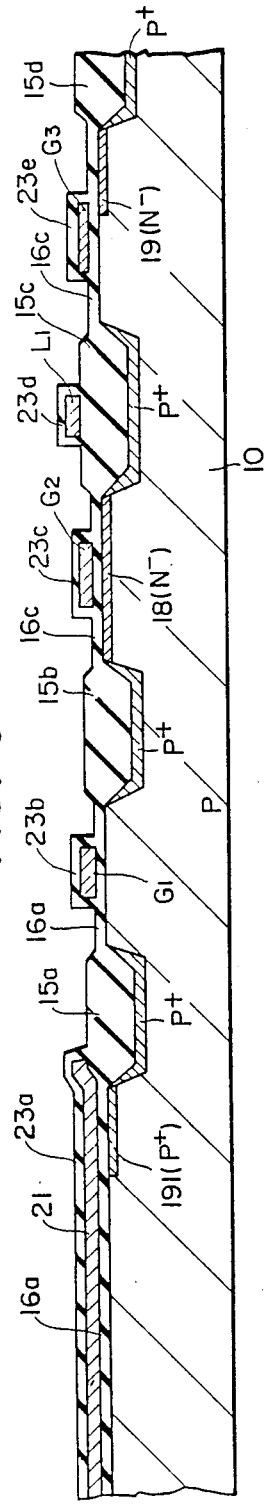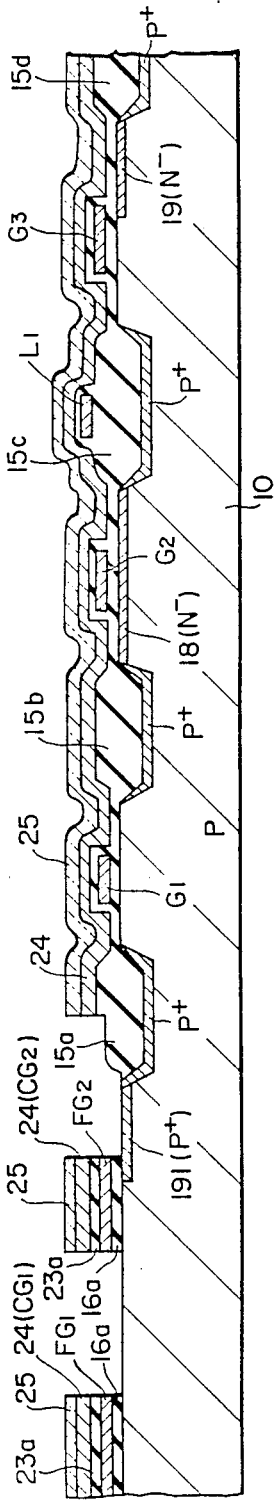

SEMICONDUCTOR INTEGRATED CIRCUIT DEVICE AND METHOD OF MANUFACTURING THE SAME

This application is a division of application Ser. No. 668,675 filed Nov. 5, 1984, now abandoned, which is a division of Ser. No. 428,954, filed Sept. 30, 1982, now abandoned, which is a division of Ser. No. 186,739 filed Sept. 12, 1980 now U.S. Pat. No. 4,373,249.

BACKGROUND OF THE INVENTION

This invention relates to a semiconductor integrated circuit device and more specifically to an EPROM (Electrically Programmable Read Only Memory) device and to a method of manufacturing such a device.

Most ordinary EPROM devices comprise a memory array portion consisting of plural MIS (Metal-Insulator-Semiconductor) type memory transistors, each having a floating gate electrode, formed on the main surface of a semiconductor substrate, for storing charges and a control gate electrode formed on the gate electrode, and a peripheral circuit portion consisting of an input-output circuit and a decoder circuit consisting of plural MIS type transistors (hereinafter called "peripheral transistors), formed in the periphery of the memory array portion.

In an EPROM device, conditions for forming the gate electrodes of the memory transistors and peripheral transistors are decisive factors for obtaining stable performance characteristics and for realizing high density of integration.

The present invention has been devised paying specific attention to the conditions for the formation of the gate electrodes.

SUMMARY OF THE INVENTION

It is an object of the present invention to provide a semiconductor integrated circuit device which has stable characteristics and also has a novel structure which leads to high density integration.

It is another object of the present invention to provide a novel fabrication method for the purpose of obtaining the above-mentioned semiconductor integrated circuit device.

The novel semiconductor integrated circuit device in accordance with the present invention is characterized by including MIS type memory transistors, each having a floating gate electrode and a control gate electrode formed on the floating gate electrode, and MIS type transistors (peripheral transistors), each formed in the periphery of the MIS type memory transistors which are also possessed of a gate electrode which is obtained by patterning the same conductor layer as is used to obtain the floating gate electrode.

BRIEF DESCRIPTION OF THE DRAWINGS

FIGS. 2 through 15 are sectional views showing the steps of the fabrication method of an EPROM device in accordance with the present invention.

DESCRIPTION OF THE PREFERRED EMBODIMENTS

The present invention will now be explained more concretely.

Figure 1:
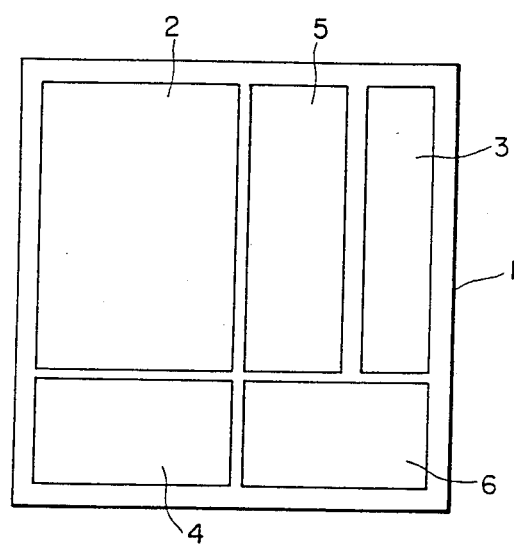
FIG. 1 is a schematic plan view of the EPROM device in accordance with the present invention.

Referring initially to FIG. 1 which shows schematically illustrates the EPROM device of the present invention, reference numeral 1 designates a semiconductor substrate (semiconductor pellet) consisting of single crystalline silicon. A memory array portion 2 consisting of plural memory transistors having the above-described structure and arranged in a matrix is formed on a part on the main surface of this substrate 1. In the periphery of this array portion 2 are arranged an input circuit portion 3, an output circuit portion 4, a decoder circuit portion 5 and an other logic circuit portion 6 that consist of depletion type MIS transistors, enhancement type MIS transistors, enhancement type MIS transistors having a high breakdown voltage structure, and so forth.

Figure 2:
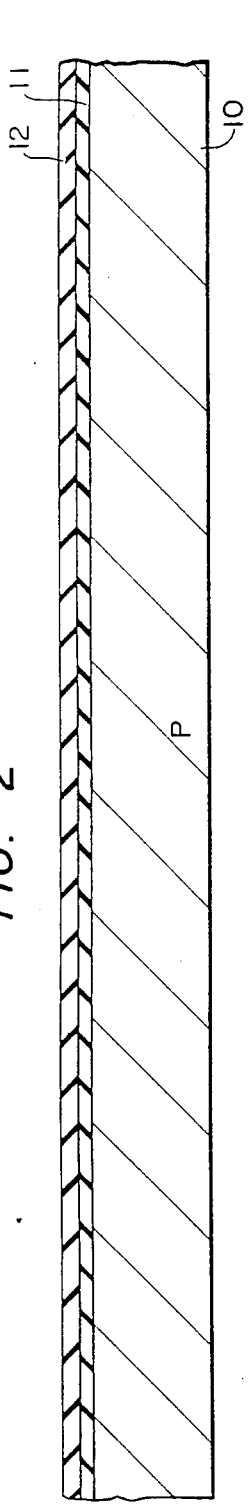

The fabrication method of the above-mentioned EPROM device will now be explained by referring to the sectional views of FIGS. 2 through 15, each showing a step in the fabrication of the EPROM device. The steps are as follows:

(a) Referring first to FIG. 2, the surface of a P-type single crystalline silicon (Si) substrate 10 is oxidized at an elevated temperature to form a 1000Å thick silicon dioxide ($SiO_2$) film 11. On the surface of this $SiO_2$ film a silicon nitride ($Si_3N_4$) film 12 having a thickness of about 1500Å is formed.

Figure 3:
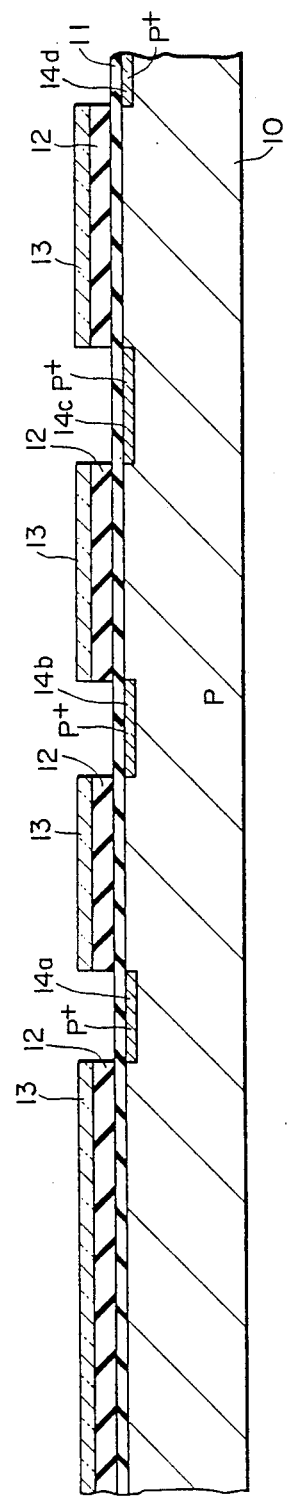

(b) As shown in FIG. 3, the $Si_3N_4$ film 12 is seleccively removed by etching using a photoresist film 13 as a mask in order to permit forming a P+ type channel stopper, which is to function as an insulation-isolation portion, in the surface of the substrate 10. Thereafter, an impurity, such as boron impurity, which establishes a P-type region for example, is introduced into the substrate 10 through the $SiO_2$ 11 by ion implantation, thereby forming P+ type channel stoppers 14a, 14b, 14c and 14d. The P+ channel stoppers prevent the surface of the substrate from being changed into an N type.

Figure 4:
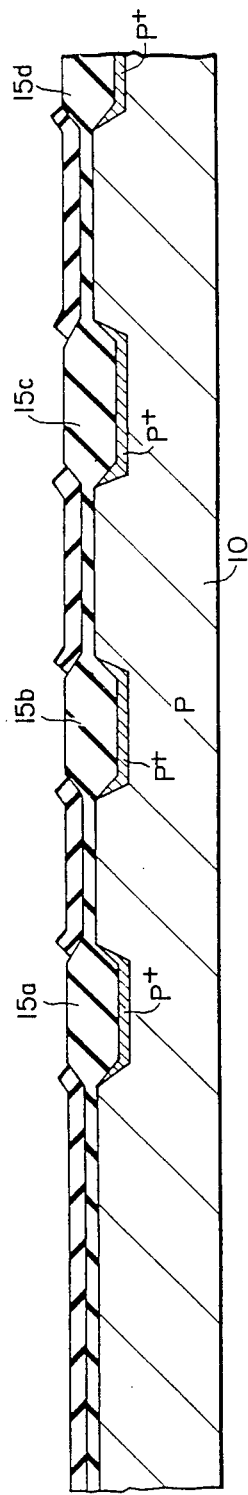

(c) As shown in FIG. 4, after the photoresist film 13 is removed, the substrate 10 is heated in an oxidizing atmosphere. Due to this heat treatment, the surface of the substrate 10 at the portions where $Si_3N_4$ is not formed (i.e., P+ channel stoppers 14a, 14b, 14c, 14d) are oxidized thereby to form an approximately 12,000 Å thick $SiO_2$ film for insulation-isolation (hereinafter called the field $SiO_2$ film) in areas 15a, 15b, 15c, and 15d. The $Si_3N_4$ film 12 and the underlying $SiO_2$ film 11 are completely removed to expose the surface of the substrate 10, and the surface of the substrate 10 thus exposed is then heat-oxidized thereby to form approximately 800 Å thick gate $SiO_2$ films 16a, 16b, 16c, 16d as shown in FIG. 5. Boron is then introduced into the surface of the substrate 10 through the gate $SiO_2$ films 16a, 16b, 16c, and 16d by the ion implantation method in order to control the threshold voltage levels of the memory transistor and peripheral transistor and especially that of the enhancement type transistor to desired voltage levels. In this instance, the implantation energy is about 70 KeV. In addition, since the field $SiO_2$ films 15a, 15b, 15c, 15d are formed to a sufficient thickness as mentioned above, boron is not introduced into the surface of the substrate 10 immediately underlying the field SiO₂ film. Accordingly, formation of a photoresist film at this step is not at all necessary.

(e) As shown in FIG. 6, using a photoresist film 17 as a mask, an impurity such as phosphorous, for example, which establishes an N-type region is introduced by the ion implantation method into a part of the surface of the substrate 10, where the depletion type MIS transistor is to be formed, and into a part of the surface of the substrate 10, where the enhancement MIS transistor having a high breakdown voltage is to be formed, through the gate SiO₂ films 16c and 16d, thereby forming an N- type channel region 18 and an N- type region 19, respectively. The ion implantation energy is suitably about 120 KeV. The surface impurity concentration in these regions 18 and 19 is about $10^{12}$ atoms/cm².

(f) As shown in FIG. 7, using a photoresist film 20 as a mask, boron is introduced by the ion implantation method into a part of the surface of the substrate 10, where the memory transistor is to be formed, through the gate SiO₂ film 16a thereby to form a P+ type region 191. The ion implantation energy is suitable about 70 KeV. The surface impurity concentration of the P+ type region 191 thus formed is about $10^{12}$ atoms/cm². This P+ type region 191 is formed in order to increase the programming efficiency of the EPROM device.

(g) As shown in FIG. 8, after the photoresist film 20 is removed, a 3500 Å thick polycrystalline silicon layer 21 is formed by a CVD (Chemical Vapor Deposition) method to form the floating gate electrode of the memory transistor, the gate electrodes of the peripheral transistors and a necessary wiring layer. This polycrystalline silicon layer 21 is selectively etched (patterned) using a photoresist 22 as a mask, thereby forming the gate electrodes G1, G2, and G3 of the peripheral transistor and the wiring layer L1. Part of this same silicon layer used to form gates G1, G2 and G3 will later form, floating gates as will be described below in connection with FIG. 10. No impurity which permits or establishes electrical conduction is allowed to exist in the polycrystalline silicon layer 21, in the gate electrodes G1, G2 and G3 and in the wiring layer L1. If any impurity is present in the polycrystalline silicon layer 21 before the patterning of the latter, contamination is apt to occur at the step of depositing the photoresist film 22, at the step of the selective removal of the photoresist film 22 and at the step of the patterning of the polycrystalline silicon layer 21, thus adversely affecting the memory retention property of the memory transistor. The above-mentioned arrangement is employed to prevent this problem.

(h) As shown in FIG. 9, after the photoresist film 22 is removed, phosphorous impurity is introduced into the polycrystalline silicon layer 21, at the locations of the gate electrodes G1, G2, G3 and the wiring layer L1 so that the layers and electrodes will have a low resistance. Thereafter, the substrate 10 is heat treated in an oxidizing atmosphere. As a result, the surfaces of the polycrystalline silicon layer 21, gate electrodes G1, G2, and G3 and wiring layer L1 are oxidized whereby 1600 Å thick SiO₂ films 23a, 23b, 23c, 23d, and 23e are formed on these layers and electrodes. These SiO₂ films function as the inter-layer insulator.

(i) A second polycrystalline silicon layer 24 is formed by the CVD method on the substrate 10 under the state shown in FIG. 9. This polycrystalline silicon layer 24 has a thickness of about 3500 Å. Again, no impurity which permits electrical conductivity is present in this polycrystalline silicon layer 24. Thereafter, as shown in FIG. 10, the polycrystalline silicon layer 24, the SiO₂ film 23a, the polycrystalline silicon layer 21 and the gate SiO₂ film 16a are sequentially and selectively etched (patterned) using a photoresist film 25 as a mask, thereby forming the control gate electrodes CG1, and CG2 and, therebelow; of the same layer as was used to form gates G1, G2, and G3, floating gate electrodes FG1, and FG2 of the memory transistor.

Figure 11:
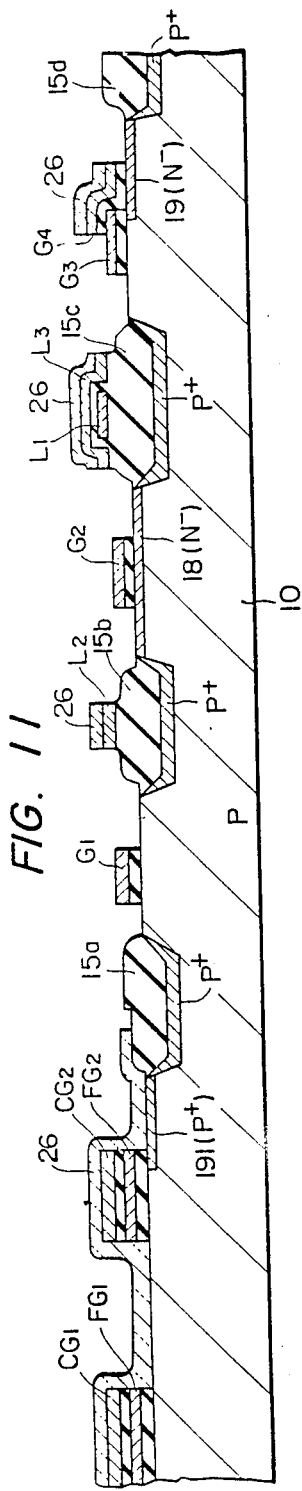

(j) As shown in FIG. 11, after the photoresist film 25 is removed, phosphorous is further introduced into the polycrystalline silicon layer 24 and into the control gate electrodes CG1 and CG2. Using a photoresist film 26 formed afresh as a mask, the polycrystalline silicon layer 24 is selectively patterned, thereby forming wiring layers L2, and L3 for the mutual connection between the peripheral transistors and an offset gate electrode G4 for the MIS type transistor having a high breakdown voltage. The further exposed SiO₂ films 23b, 23c, 23e and gate SiO₂ films 16b, 16c, 16d are etched completely.

Figure 12:
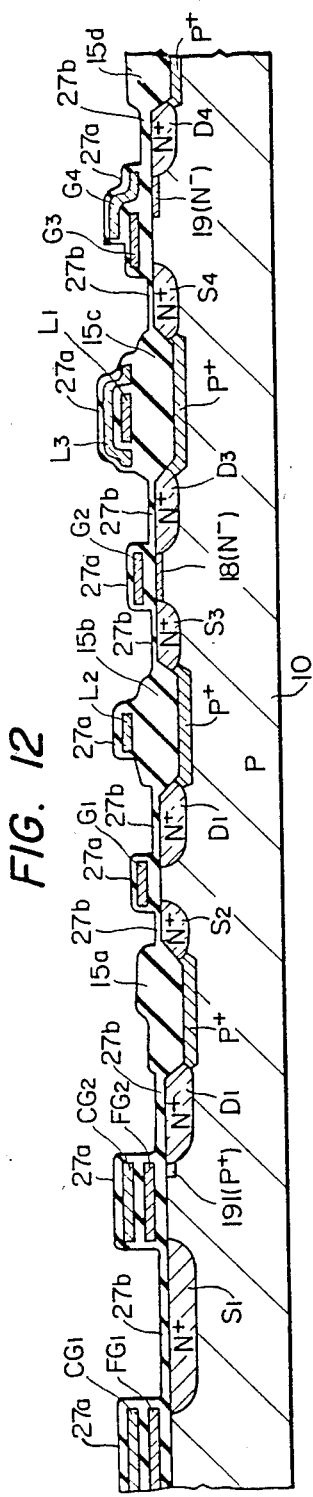

(k) As shown in FIG. 12, after the photoresist film 26 is removed, phosphorous is deposited into the exposed surface of the substrate 10 and extension diffusion is effected thereby to form source regions S1, S2, S3, and S4 and drain regions D1, D2, D3 and D4. The depth of these regions is 1 u and the surface impurity concentration is $10^{15}$ atoms/cm². Further, the surfaces of the gate electrodes (CG1, CG2, G1, G2, G3, and G4), wiring layers (L2, and L3), source regions (S1, S2, S3, and S4) and drain regions (D1, D2, D3, and D4), that are exposed, are oxidized at a low temperature of 800° C. (at which these regions are not extended) in the oxidizing atmosphere. The thickness of the SiO₂ films 27a, and 27b formed on the surfaces of these electrodes, wiring layers and regions is about 1200 Å.

Figure 13:
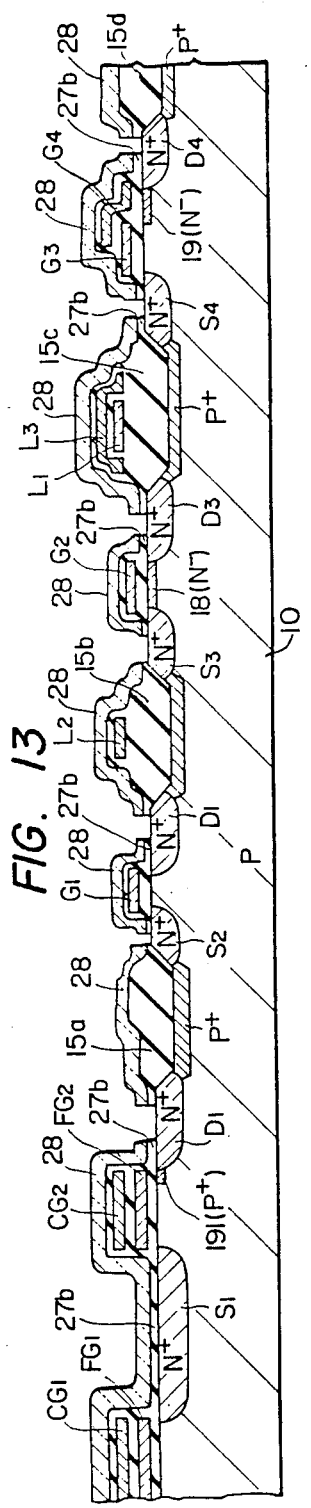

(l) As shown in FIG. 13, using a photoresist 28 as a mask, the SiO₂ film 27b on the source region and drain regions is selectively etched.

Figure 14:
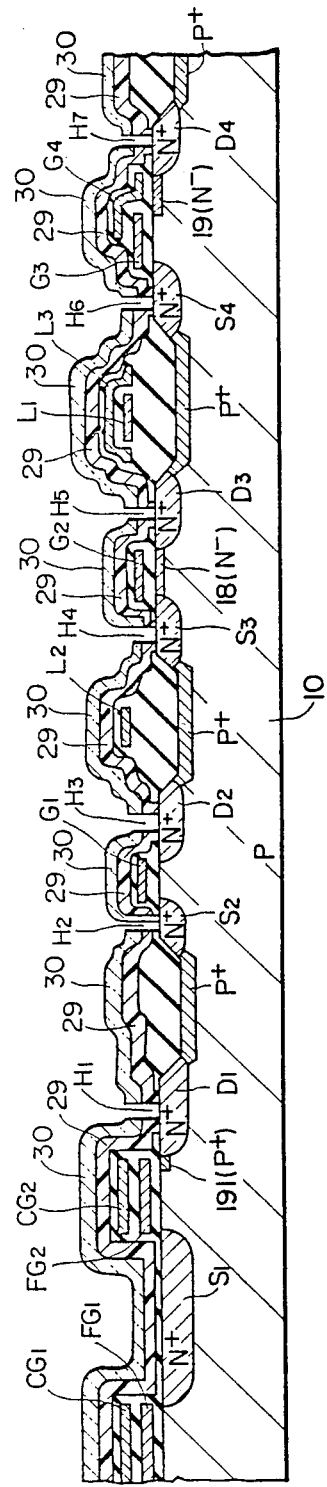

(m) As shown in FIG. 14, after the photoresist film 28 is removed, a phosphosilicate glass (PSG) film 29 is formed on the substrate 10. The thickness of this PSG film 29 is about 6000 Å. Using a photoresist film 30 as a mask, the PSG film 29 is selectively etched, thereby forming contact holes H1, H2, H3, H4, H6, H7.

Figure 15:
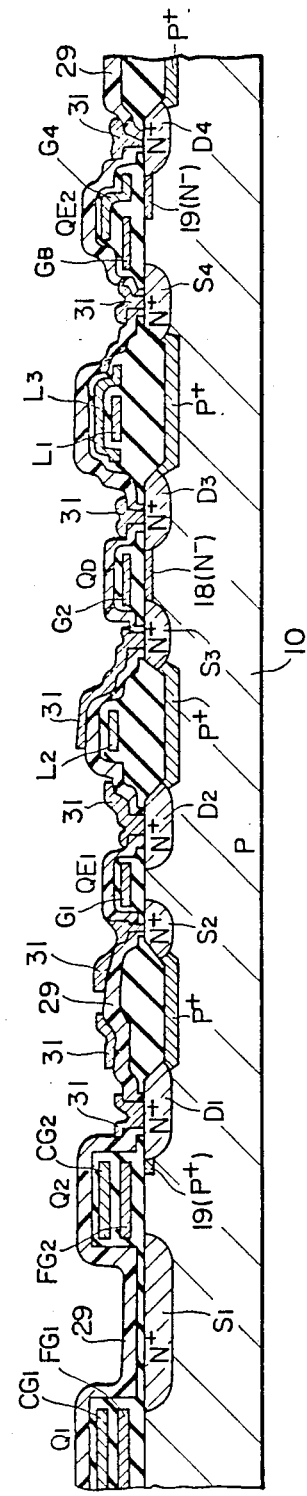

(n) As shown in FIG. 15, after the photoresist film 30 is removed, aluminum is vaporized onto the substrate 10. This aluminum is patterned to thereby form a wiring layer 31. Although not shown in the drawing, the gate electrodes G3, and G4 of the enhancement type MIS transistor having a high breakdown voltage are mutually connected by the above-mentioned aluminum wiring layer.

As mentioned above, according to the method of the present invention, there are formed the memory transistors Q1, and Q2, the enhancement type MIS transistor QE1 as the peripheral transistor, the depletion type MIS transistor QD and the enhancement type MIS transistor QE2 having a high breakdown voltage.

Next, the action and effect of the present invention will be explained as follows.

As can be appreciated from the above-mentioned embodiment, the floating gate electrodes, FG1 and FG2 and the gate electrodes G1, G2 and G3 of the peripheral transistors are formed by patterning the polycrystalline silicon layer (conductor layer) of the first layer. Accordingly, the present invention provides an EPROM device having more a stable characteristics in comparison with an EPROM device which has a peripheral transistor structure in which the second polycrystalline silicon layer is used as the gate electrode, which is the same as is used for the control gate electrode of the memory transistor, for example. Namely, in the above-mentioned prior art structure, the impurity such as phosphorous, which is contained in the first polycrystalline silicon layer and is deposited for the formation of the floating gate electrode of the memory transistor, diffuses out during the formation of the gate oxide film of the memory transistor and comes into the substrate of the peripheral transistor. For this reason, variance in a threshold voltage (Vthz) occurs between the resulting plural peripheral transistors. In the transistor structure of the present invention, on the other hand, this problem is eliminated because the gate electrode is formed by the first polycrystalline silicon layer.

Since the gate electrode of the peripheral transistor is formed by the first polycrystalline silicon layer, connection between the transistors in the second polycrystalline silicon layer is facilitated and it is thus possible to obtain an EPROM device of a structure having a high density of integration. It is possible, for example, to form a number of structures in which the wiring layer L1 crosses the wiring layer L2, in the peripheral circuit portion as shown in FIG. 15.

The polycrystalline silicon is specifically employed as the gate electrode and wiring layers. This polycrystalline silicon has high adhesion to the insulating film such as the $SiO_2$ film and does not form cut portions especially at the step portions of the $SiO_2$ film. Further, this polycrystalline silicon is easily converted into the $SiO_2$ film when oxidized in the oxidizing atmosphere. Accordingly, the insulation between the wirings can easily be accomplished by this $SiO_2$ film.

As explained in the step (e), the impurity (phosphorous) is implanted into the first polycrystalline silicon layer of the portion forming the memory transistor, into the gate electrode after the formation of the gate electrode of the peripheral transistor and into the wiring layer after the formation of the gate electrode of the peripheral transistor and the wiring layer. In other words, the first polycrystalline silicon layer is subjected to the phosphorous treatment. Since the phosphorous treatment is not carried out at the stage of the treatment of the first polycrystalline silicon layer which is effected for the purpose of forming the gate electrode of the peripheral transistor and the wiring layer, the first polycrystalline silicon layer at the portion forming the memory transistor is not easily contaminated. Consequently, a stable $SiO_2$ film is formed on the surface of this polycrystalline silicon layer, thereby yielding a memory transistor having a stable memory retention property.

Especially in forming the high breakdown voltage enhancement type MIS transistor QE2, the offset gate electrode can be formed without increasing the number of man-hours for the fabrication in particular. Furthermore, the N- type region can be formed simultaneously with the formation of the channel region of the depletion type MIS transistor. It is thus possible to readily obtain the enhancement type MIS transistor QE2 having a high breakdown voltage.

Next, modified embodiments of the present invention will be explained as follows.

Figure 16:
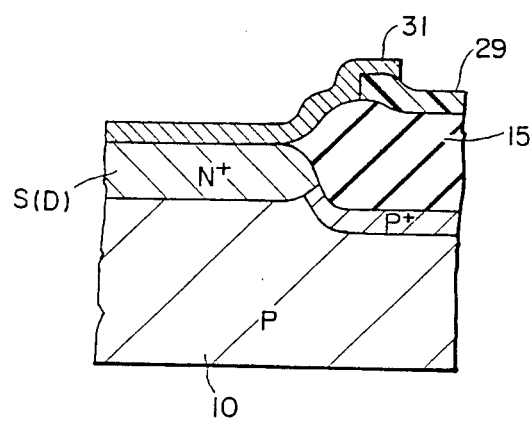
FIG. 16 is a partial sectional view of an EPROM device in accordance with another embodiment of the present invention.

The contact portion between the source region S (drain region D) and the wiring layer 31 in the memory transistor or the peripheral transistor can be formed in a structure such as shown in FIG. 16. For, since the thick field $SiO_2$ film 15 exists below the PSG film 29, the contact hole of the PSG film 29 can be formed with sufficient allowance.

In the peripheral transistor portion, high density integration of the EPROM device can be realized by extending the electrodes of the source region and the drain region using the second polycrystalline silicon layer. In this case, the photoresist processing step for selectively exposing the substrate 10 is necessary immediately before the aforementioned step (g).

Figure 17:
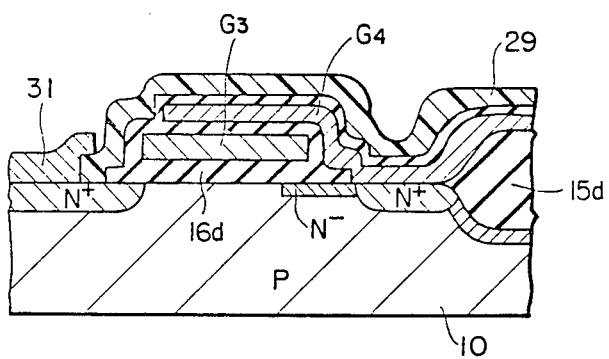
FIGS. 17 and 18 are partial sectional views of an enhancement type MIS transistor having a high breakdown voltage in accordance with another embodiment of the present invention.
Figure 18:
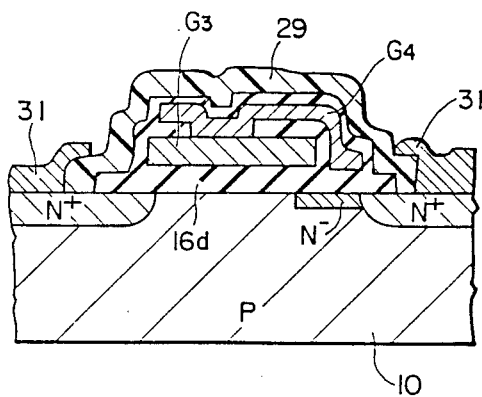

The gate structure (G3 and G4) of the gate electrodes of the enhancement type MIS transistor QE2 may be of such a type as shown in FIG. 17 or 18. In these drawings, the offset electrode G4 is formed by patterning the second polycrystalline silicon layer.

The second polycrystalline silicon layer may be replaced by a conductor layer consisting of a metallic material such as molybdenum, for example. Since molybdenum is a metal having a high melting point, it can play the role of the impurity mask in forming the source-drain region. The wiring layer formed by such a metallic material has a sheet resistance lower than that of the wiring layer consisting of the polycrystalline silicon and it can improve the switching speed of the EPROM device.

What is claimed is:

1. a method of fabricating a semiconductor memory device, including: a memory array portion formed on a semiconductor substrate at a first location of one main surface thereof and including a plurality of MIS memory transistors, said MIS memory transistors being respectively formed at first areas of said first location and each having a floating gate electrode and a control gate electrode overlying said floating gate electrode; and a peripheral circuit portion formed at a second location of said semiconductor substrate different from said first location in association with said memory array portion and including a plurality of MIS transistors and wiring lines, said MIS transistors being respectively formed at second areas of said second location and each having a gate electrode, comprising the steps of:

forming a first insulating film on said semiconductor substrate at said first location and said second location;

forming a first layer of conductive material on said first insulating film at said first location and said second location;

patterning said first layer of conductive material on said first insulating film at said second location so as to form at least some of said gate electrodes;

forming a second insulating film on said first layer of conductive material;

forming a second layer of conductive material on said second insulating film at said first location and at said second location;

patterning said second layer of conductive material, said second insulating film, said first layer of conductive material and said first insulating film at said first location using a photoresist film as a mask so as to form said control gate electrode and said floating gate electrode of said memory array portion; and patterning said second layer of conductive material at said second location.

2. The method according to claim 1, wherein said conductive material of said first layer is polycrystalline silicon doped with an impurity and said insulator film on said first layer of conductive material is an oxide of the polycrystalline silicon of said first layer.

3. The method according to claim 2, wherein said second layer of conductive material is a polycrystalline silicon layer.

4. The method according to claim 3, comprising forming said first and second polycrystalline silicon layers by the chemical vapor deposition method.

5. The method according to claim 4, wherein said first and second layers are approximately 3500A thick.

6. The method according to claim 5, wherein said first and second layers of conductive material are doped with phosphorous.

7. The method according to claim 1, and further including depositing a phosphosilicate glass film over said substrate and patterning said film with contact holes.

8. The method according to claim 7, and further including forming a further patterned layer of conductive material over said phosphosilicate glass film and extending through said contact holes to form a further wiring layer.

* * * * *